(12) United States Patent
Shibata et al.

(10) Patent No.: US 8,358,422 B2
(45) Date of Patent: Jan. 22, 2013

(54) ROBOT AND AUTO-ZEROING METHOD

(75) Inventors: Takeshi Shibata, Akashi (JP); Kenichi Sasaki, Kakogawa (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 0 days.

(21) Appl. No.: 13/256,375

(22) PCT Filed: Mar. 8, 2010

(86) PCT No.: PCT/JP2010/053763
§ 371 (c)(1),
(2), (4) Date: Sep. 13, 2011

(87) PCT Pub. No.: WO2010/106937
PCT Pub. Date: Sep. 23, 2010

(65) Prior Publication Data
US 2012/0002216 A1     Jan. 5, 2012

(30) Foreign Application Priority Data
Mar. 17, 2009  (JP) ................................ 2009-064601

(51) Int. Cl.
*G01B 11/14* (2006.01)

(52) U.S. Cl. ........................................ 356/614; 356/615

(58) Field of Classification Search .......... 356/614–615, 356/138–139, 620–623, 139.07, 139.05, 356/141.1–141.2, 152.1–152.3; 33/1 M, 33/286, 293, 559; 702/94–95, 150–151, 702/127; 700/254, 213, 166, 245, 250, 90; 901/16, 2, 46–47, 14; 74/490.01, 479.01
See application file for complete search history.

(56) References Cited

U.S. PATENT DOCUMENTS
6,317,699 B1    11/2001    Watanabe et al.
2002/0013675 A1    1/2002    Knoll et al.

FOREIGN PATENT DOCUMENTS

| | | |
|---|---|---|
| JP | A-05-004179 | 1/1993 |
| JP | A-05-069356 | 3/1993 |
| JP | A-08-090464 | 4/1996 |
| JP | A-11-090883 | 4/1999 |
| JP | A-2002-529266 | 9/2002 |
| JP | A-2003-039354 | 2/2003 |
| JP | A-2004-241484 | 8/2004 |
| WO | WO 98/32571 A1 | 7/1998 |
| WO | WO 2007/090002 A2 | 8/2007 |

OTHER PUBLICATIONS

International Search Report in International Application No. PCT/JP2010/053763; dated Jun. 8, 2010 (with English-language translation).

Apr. 11, 2011 International Preliminary Report on Patentability issued in International Patent Application No. PCT/JP2010/053763.

*Primary Examiner* — Tri T Ton
(74) *Attorney, Agent, or Firm* — Oliff & Berridge, PLC

(57) ABSTRACT

The invention provides a robot including a connection member relatively displaceably connected, and configured to control the displacement of the connection member based on a reference posture that can be adjusted, the robot including: a light emitting unit to emit a laser beam in a predetermined direction; a light receiving unit to receive the laser beam when the connection member is located in a detection posture that is away, by a preset displacement amount, from a predetermined zero posture; and a zeroing unit to relatively displace the connection member so as to make the light receiving unit receive the laser beam, and then to adjust the reference posture to the zero posture based on the posture of the connection member when the laser beam is received as well as on a relationship between the zero posture and the detection posture.

3 Claims, 11 Drawing Sheets

ROBOT AND AUTO-ZEROING METHOD

TECHNICAL FIELD

The present invention relates to a robot including a plurality of connection members, respectively connected with one another, such that the connection members can be displaced relative to one another.

BACKGROUND ART

In the industrial field, various robots are widely used. For instance, in the field of processing semiconductors, a carrier robot is used in an apparatus for carrying substrates. This carrying apparatus constitutes one semiconductor processing equipment and serves as a front-end module for the semiconductor processing equipment, together with a plurality of semiconductor processing apparatuses respectively provided for performing different processes for the semiconductors.

FIG. 10 is an enlarged perspective view partly showing the carrier robot 1 in the related art, and FIG. 11 is a plan view of the carrier robot 1 shown in FIG. 10. This carrier robot 1 includes a base 2, and a lifting unit 3 provided to the base 2. Further, an arm 4 is attached to the lifting unit 3, such that this arm 4 can be lifted in the vertical direction as well as can be angularly displaced in the horizontal direction.

The arm 4 includes three connection members, i.e., a first connection member 5, a second connection member 6 and one robot hand 7. The first connection member 5 is attached to the lifting unit 3, such that this connection member 5 can be angularly displaced relative to the lifting unit 3. Further, the first connection member 5 is connected with the second connection member 6, and this second connection member 6 is further connected with the robot hand 7. In this case, the first connection member 5, second connection member 6 and robot hand 7 can be angularly displaced, respectively, relative to one another, about axes L1 to L3.

The carrier robot 1 constructed as described above further includes a control unit (not shown). This control unit serves to angularly displace the first connection member 5, second connection member 6 and robot hand 7, about the axes L1 to L3, while controlling the angle of each connection member 5, 6, 7. Namely, in this control unit, the angle in a zero posture of each connection member 5, 6, 7 upon shipment from a factory or the like is set in advance at 0 degree. Thereafter, the control unit serves to control each angle, about the axes L1 to L3, of the first connection member 5, second connection member 6 and robot hand 7, in order to change the posture of each connection member 5, 6, 7 into a desired posture, thereby moving the robot hand 7 to a desired position.

However, due to inadvertent or accidental collision between the arm 4 and other structures provided in each semiconductor processing apparatus and/or due to prolonged use of the carrier robot 1, each of the first connection member 5, second connection member 6 and robot hand 7 is sometimes angularly shifted from a correct position or angle about each corresponding axis L1 to L3. In such a case, even if the angle of each connection member 5, 6, 7 is set again at 0 degree, the connection member 5, 6 or 7 can no longer be returned to the zero posture. Therefore, in such a state, even if the control unit angularly displaces each connection member 5, 6, 7 by a predetermined angle, the robot hand 7 will be located in a position shifted from a predetermined position. To address this problem, it is necessary to adjust the zero posture of each connection member 5, 6, 7 to 0 degree. As the method for this adjustment, the so-called "zeroing method" has been known. This zeroing method is also used for adjusting the angle in the zero posture of each connection member 5, 6, 7 before the shipment from the factory to 0 degree.

As one example of the zeroing method, one approach using a jig pin 8 has been known. In the case of using this method, two through holes, for allowing the jig pin 8 to be inserted therein, are respectively provided to the first connection member 5 and second connection member 6. More specifically, when the first connection member 5 and second connection member 6 are angularly moved, respectively, by predetermined angles about the axis L2 from the zero postures thereof, the two through holes are in communication with each other, and thus the jig pin 8 can be inserted in such communicated two through holes. Further, a notched portion 9 is formed in the robot hand 7. In this case, when the second connection member 6 and robot hand 7 are angularly moved, respectively, by predetermined angles about the axis L3 from the zero postures thereof, the jig pin 8 can be in contact with the notched portion 9.

Namely, with the provision of such a jig pin 8 as described above, the angle of each connection member 5, 6, 7 relative to the zero posture thereof can be detected, and then each zero posture can be adjusted to 0 degree, based on the detected angle.

RELATED ART DOCUMENT

Patent Document

Patent document 1: JP5-4179A

However, in the zeroing method using the jig pin as described above, a detection error may tend to occur due to variations in size of the two through holes and notched portion 9. Therefore, in order to control this detection error, it is necessary to improve the accuracy in size of the two through holes and notched portion 9. For instance, it is necessary to reduce each caliber or diameter of the two through holes and notched portion 9. However, such reduced caliber or diameter should make it rather difficult to insert the jig pin 8 in the two through holes as well as make it difficult to properly fit the jig pin 8 in the notched portion 9. Besides, such a difficult work should substantially increase the time required for adjusting the zero posture.

In order to address this inconvenience, it can be thought out to form each diameter of the two through holes and notched portion 9, substantially larger than the diameter of the jig pin 8. It is true that such enlargement of each diameter can facilitate the insertion or fitting of the jig pin 8 relative to the two through holes and notched portion 9. However, such an enlarged diameter of the holes or the like should be accompanied by the aforementioned detection error. Of course, with increase of such a detection error, the robot hand 7 should be rather shifted from the desired position.

Further, in the above zeroing method using the jig pin 8, it is necessary for a worker or the like to insert the jig pin 8 in the two through holes and then confirm whether or not the jig pin 8 is properly fitted in the notched portion 9. Therefore, in order to perform this work, the worker or the like should enter the carrying apparatus. However, when the worker enters the carrying apparatus, the cleanliness in the semiconductor processing equipment that has been so far kept at a higher level should be substantially degraded. Namely, since a considerably high level of the cleanliness is required for the space in the semiconductor processing equipment, it is necessary to elevate and stabilize again the cleanliness after such a zeroing work (i.e., after the worker enters in this equipment). Therefore, once the zeroing work is performed in such a manner, it should take so much time to return the semiconductor processing equipment into an adequately normal operative condition.

DISCLOSURE OF THE INVENTION

The present invention was made to solve the above problems. Therefore, it is an object of this invention to provide the robot and zeroing method, respectively configured to adjust a reference posture to the zero posture, automatically and accurately, without the need for any manual operation of the worker.

In one aspect for achieving the above challenge, the present invention provides a robot having an auto-zeroing function, including a connection member relatively displaceably connected, and being configured to control a displacement of the connection member based on a reference posture that can be adjusted, the robot comprising: a light emitting unit configured to emit a laser beam in a predetermined direction;

a light receiving unit configured to receive the laser beam when the connection member is located in a detection posture that is away, by a preset displacement amount, from a predetermined zero posture; and a zeroing unit configured to relatively displace the connection member so as to make the light receiving unit receive the laser beam, and then to adjust the reference posture to the zero posture based on a posture of the connection member when the laser beam is received as well as on a relationship between the zero posture and the detection posture.

According to this invention, the reference posture can be adjusted to the zero posture by using the laser beam. Therefore, with highly enhanced accuracy of the attachment for the light emitting unit, the reference posture can be adjusted to the zero posture more accurately. Thus, the displacement of the connection member can be controlled with higher accuracy.

Further, in this invention, the reference posture is adjusted to the zero posture by using the laser beam, wherein the zeroing unit serves to automatically relatively displace the connection member, such that the light receiving unit can receive the laser beam, and then adjust the reference posture to the zero posture. Therefore, there is no need for the worker to manually adjust the reference posture to the zero posture. Thus, even in such a place that makes it difficult for the worker to operate the robot or place that is unsuitable for such operation, the reference posture can be readily adjusted to the zero posture.

Preferably, in the present invention, the zeroing unit first relatively displaces the connection member in one direction so as to make the light receiving unit receive the laser beam, and then relatively displaces the connection member in another direction different from the one direction so as to make the light receiving unit receive the laser beam, and thereafter determines an average value of postures of the connection member respectively detected when the laser beam is received upon a displacement in the one direction and when the laser beam is received upon a displacement in the another direction as a posture of the connection member when the laser beam is received.

In some cases, depending on variations in the construction and accuracy of attachment of the light receiving unit, the postures of the connection member, respectively detected when the laser beam is received upon the displacement in one direction and when the laser beam is received upon the displacement in the other direction, will differ from each other. In such a case, the posture of the connection member when the laser beam is detected will be sometimes shifted substantially in a certain direction from the detection posture. Therefore, there is a risk that the reference posture, after it has been adjusted, may be considerably shifted from the zero posture.

However, according to the above aspect of the present invention, the average value of the postures of the connection member, respectively detected when the laser beam is received upon the displacement in one direction and when the laser beam is received upon the displacement in the other direction, is used as the posture of the connection member when the laser beam is received. Therefore, even in the case of using such a light receiving unit as described above, the difference or shift in the detection posture depending on the direction in which the connection member is relatively displaced can be significantly reduced. As such, even in the case of displacing the connection member in either of the one direction and the other direction, substantially the same detection posture can be obtained or detected by a sensing operation.

Preferably, in the present invention, the detection posture is the zero posture.

According to this invention, due to a simple relationship between the detection posture and the zero posture, the reference posture can be readily adjusted to the zero posture.

Preferably, in the present invention, the robot further comprises: a base to which a plurality of connection members are attached such that the connection members can be respectively displaced relative to the base as well as can be respectively displaced relative to one another; and a reflector provided to each of the plurality of connection members and configured to reflect the laser beam emitted from the light emitting unit, wherein the light emitting unit and the light receiving unit are provided to the base.

According to this invention, the number of the light emitting unit and light receiving unit can be significantly reduced, thereby reducing the number of the components used in the robot. As such, the production cost can be reduced.

Preferably, in the present invention, the reflector is a regression-type reflector. The light emitting unit and the light receiving unit are integrated together so as to constitute a coaxial laser sensor. According to this invention, even in the case of relatively low accuracy of attachment for such reflector and/or sensor, the light reflected from each reflector can be adequately received, thereby enhancing the yield.

Preferably, in the present invention, the zeroing unit adjusts the reference posture one after another from the connection member positioned nearer to the base. According to this invention, since the zeroing unit adjusts each reference posture to the zero posture, one after another, from the connection member positioned nearer to the base, the reference posture of each connection member can be adjusted at a time. Thus, the time required for adjusting each reference posture can be significantly saved.

Preferably, in the present invention, the connection members are respectively configured to be rotatable relative to one another. The zeroing unit adjusts the connection member to the zero posture when a torque applied to the connection member upon a relative pivot movement becomes equal to or greater than a preset torque, or when an angular shift between a relative angle and a target angle of the connection member becomes equal to or greater than a preset value, or when the deviation between the relative angle and the target angle of the connection member becomes equal to or greater than a preset value.

According to this invention, when considerably great torque is applied to a certain connection member, or when the angular shift between the relative angle and the target angle of a certain connection member becomes equal to or greater than the preset value, or when the deviation between the relative angle and the target angle of a certain connection member becomes equal to or greater than the preset value, due to, for example, inadvertent or accidental collision or the like of the connection member, the reference posture of this connection member is automatically adjusted to the zero posture. Therefore, the operation of the robot can be started again soon after such collision or the like.

Further, the present invention provides an auto-zeroing method for adjusting a reference posture of a robot including a connection member relatively displaceably connected and configured to control a displacement of the connection member based on the reference posture that can be adjusted, the method comprising: a laser beam receiving step of relatively displacing the connection member to a detection posture that is away from a predetermined zero posture by a preset displacement amount, thereby receiving a laser beam; and a reference posture adjustment step of adjusting the reference posture to the zero posture based on a posture of the connection member when the laser beam is received in the laser beam receiving step as well as on a relationship between the zero posture and the detection posture.

According to this invention, since the reference posture is adjusted to the zero posture by utilizing the laser beam, the accuracy of the adjustment for the reference posture to the zero posture can be enhanced by improving the accuracy of detection of the laser beam in the direction in which the laser beam travels. Thus, the reference posture can be adjusted to the zero posture with high accuracy. In addition, the displacement of the connection member can be controlled, more accurately.

Further, in this invention, the reference posture is adjusted to the zero posture by using the laser beam, while the connection member is automatically relatively displaced. Therefore, there is no need for the worker to manually adjust the reference posture to the zero posture. Thus, even in such a place that makes it difficult for the worker to operate the robot or place that is unsuitable for such work, the reference posture can be readily adjusted to the zero posture.

Preferably, in the laser beam receiving step, the connection member is first relatively displaced in one direction so as to receive the laser beam, and then the connection member is relatively displaced in another direction different from the one direction so as to receive the laser beam. In the reference posture adjustment step, an average value of postures of the connection member respectively detected when the laser beam is received upon a displacement in the one direction and when the laser beam is received upon a displacement in the another direction is determined as a posture of the connection member when the laser beam is received.

According to this invention, even if one posture detected when the laser beam is received upon the relative displacement in one direction is different from another posture detected when the laser beam is received upon the relative displacement in the other direction, such a difference or shift in the posture when the laser beam is received, depending on the direction in which the connection member is relatively displaced, can be adequately reduced, by using the average value of the postures of the connection member, respectively detected when the laser beam is received upon the displacement in one direction and when the laser beam is received upon the displacement in the other direction, as the posture of this connection member when the laser beam is received. Accordingly, once the adjustment for the posture is performed according to this invention, the laser beam will be received in substantially the same posture, even in the case in which the connection member is relatively displaced in either of the one direction and the other direction.

Preferably, in this invention, a plurality of connection members are respectively attached to a base such that the connection members can be respectively displaced relative to the base, as well as can be respectively displaced relative to one another. The laser beam receiving step and the reference posture adjustment step are respectively performed one after another from the connection member positioned nearer to the base.

According to this invention, since each reference posture is adjusted to the zero posture, one after another, from the connection member positioned nearer to the base, the reference posture of each connection member can be adjusted at a time. As such, the time required for adjusting the reference posture can be significantly reduced.

Further, the present invention provides the robot having the auto-zeroing function, which includes the plurality of connection members respectively connected relatively displaceably, and is configured to control the displacement of each connection member based on each reference posture that can be adjusted, wherein this robot features to include: the light emitting unit configured to emit the laser beam in one predetermined direction; the light receiving unit configured to receive the laser beam, when at least one of the connection members is located in the detection posture that is away, by the preset displacement amount, from the predetermined zero posture; and the zeroing unit configured to relatively displace the at least one of the connection members, controlling the light receiving unit to receive the laser beam, and then adjusting the reference posture to the zero posture, based on the posture of the at least one of the connection members when the laser beam is received as well as on the relationship between the zero posture and the detection posture.

Effect of Invention

Therefore, according to the present invention, the reference posture can be adjusted to the zero posture, automatically and accurately, without the need for the worker to manually adjust the reference posture.

MODE FOR CARRYING OUT THE INVENTION

Figure 1:
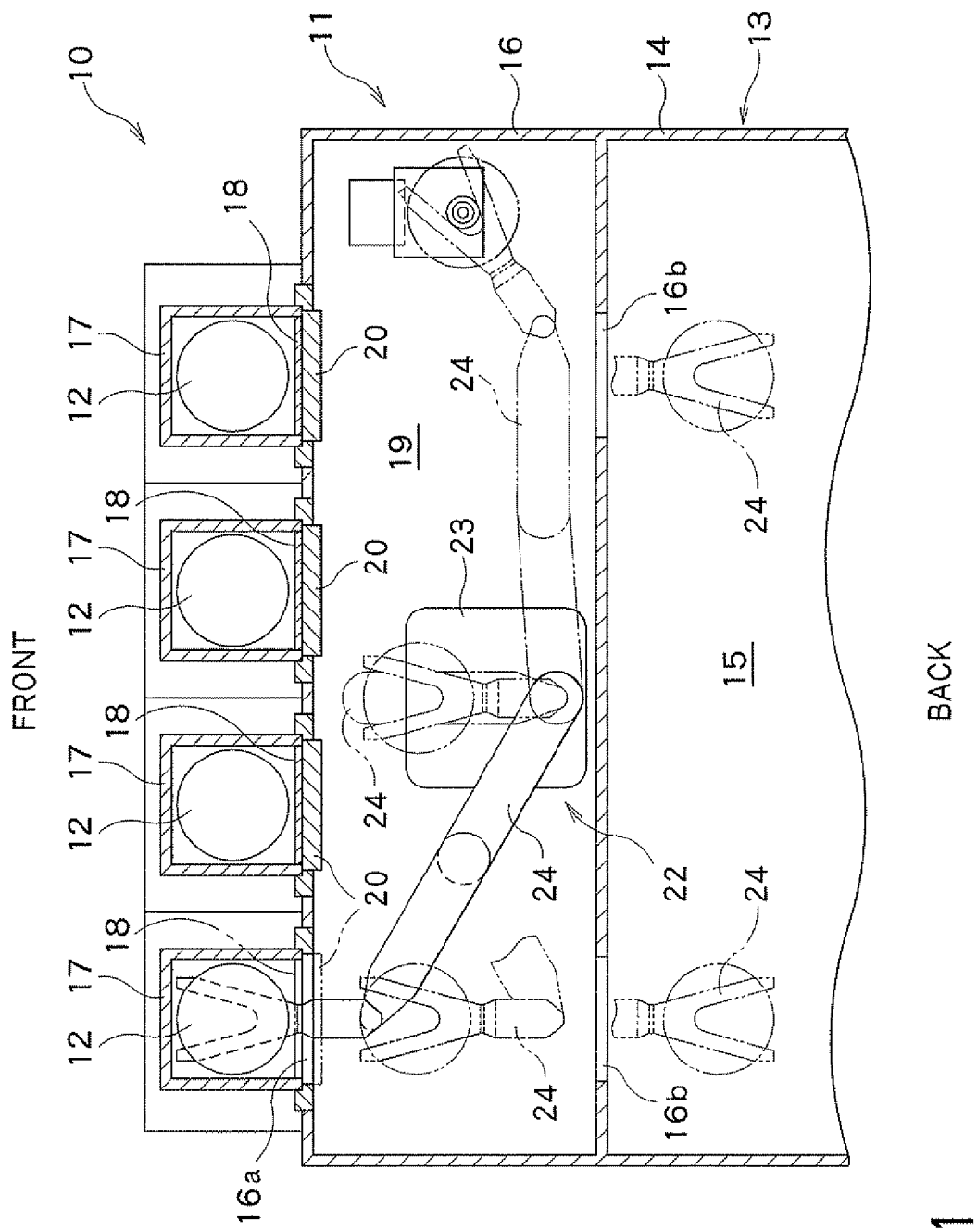
FIG. 1 is a plan view partly showing the semiconductor processing equipment including a wafer carrying apparatus according to one embodiment of the present invention.
Figure 2:
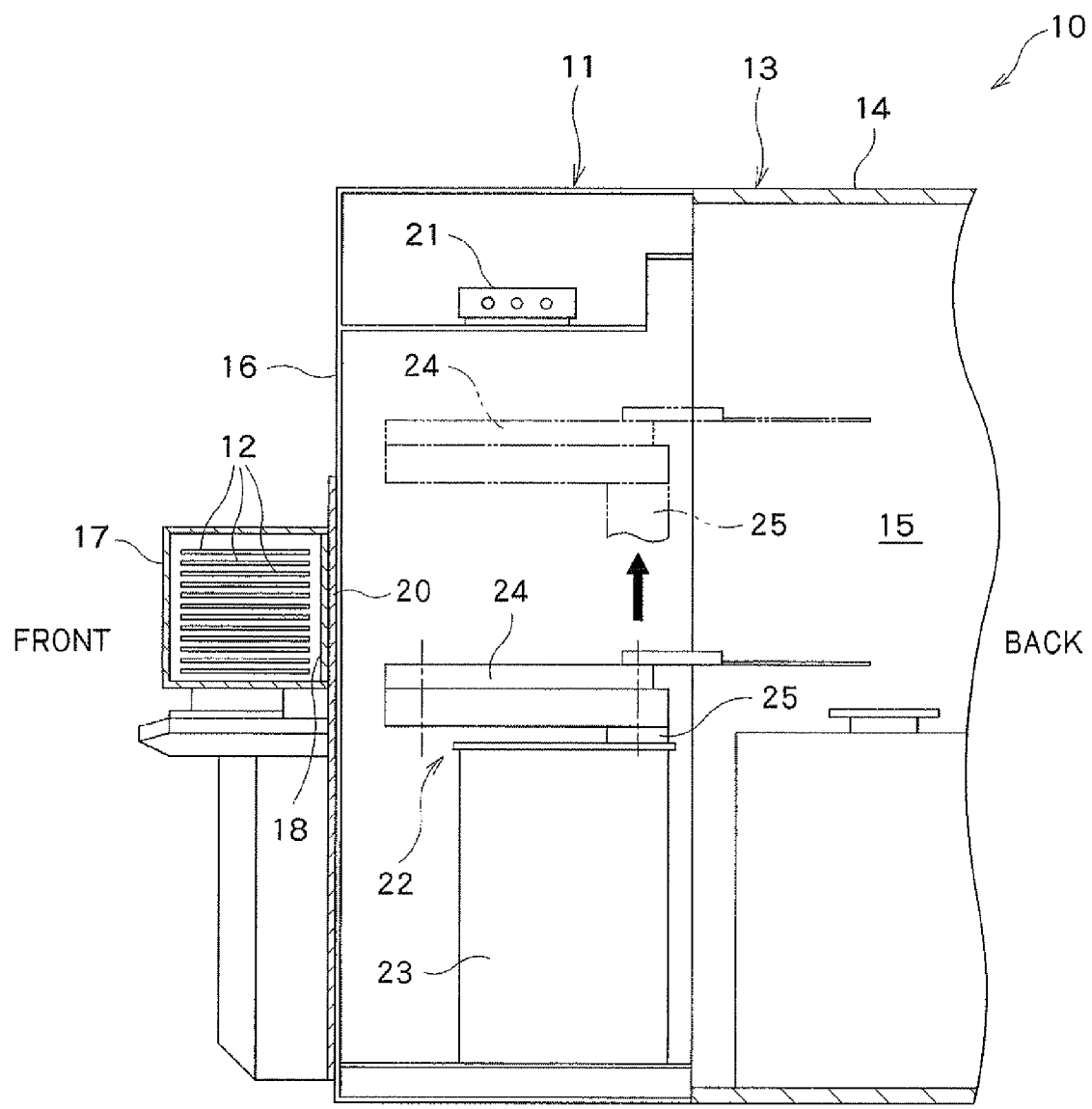
FIG. 2 is a section partly showing the semiconductor processing equipment.

As shown in FIGS. 1 and 2, the semiconductor processing equipment 10 including the wafer carrying apparatus 11 according to one embodiment of the present invention is intended for providing a predetermined semiconductor process to each semiconductor wafer 12. As the semiconductor process provided to each semiconductor wafer 12, various processes, such as heating, impurity introduction, thin-film forming, lithography, cleaning, flattening and the like, can be mentioned. In this case, the semiconductor processing equipment 10 includes a processing apparatus 13 and the carrying apparatus 11.

The processing apparatus 13 includes a processing-side housing 14 and a processing-side control apparatus (not shown). The processing-side control apparatus is composed of a fan filter unit or the like, and serves to keep the cleanliness in a processing space 15 of the processing-side housing 14 at a desired high level. In the processing space 15, various processing units (not shown) are provided for respectively providing each process as described above to each wafer 12. Thus, each desired process can be provided to each wafer 12 in each processing unit.

The carrying apparatus 11 is provided as the front-end module attached to a front face of the processing apparatus 13, and serves to carry each wafer 12 to each processing unit provided in the processing space 15, and take out each wafer 12 from each processing unit of the processing space 15. The carrying apparatus 11 includes a carrier-side housing 16. A plurality of FOUPs 17 (in this embodiment, four FOUPs 17) are provided outside relative to a front face of the carrier-side housing 16.

Each FOUP 17 is provided for storing therein a plurality of wafers 12. More specifically, in each FOUP 17, the plurality of wafers 12 are respectively stacked in the vertical direction (e.g., as shown in FIG. 2), and the so-called mini-environment in this FOUR 17 is created to keep the cleanliness surrounding such stacked wafers 12 at a desired level. The internal space of each FOUR 17 is communicated with a carrying space 19 in the carrying apparatus 11, via a communication opening 16a provided to the carrier-side housing 16. Each communication opening 16a can be optionally opened and closed by a FOUR-side door 18 provided to each FOUR 17.

A plurality of FOUR openers 20 (in this embodiment, four FOUR openers 20) and a carrier-side control apparatus 21 are respectively provided to the carrier-side housing 16. Each FOUR opener 20 is provided to each corresponding FOUR 17, and is optionally opened and closed in order to open and close each corresponding communication opening 16a.

On the back face side of the carrier-side housing 16, communication holes 16b are provided for respectively communicating the carrying space 19 with the processing space 15. Therefore, the cleanliness in the carrying space 19 has also to be kept at a high level as in the processing space. Therefore, the carrier-side control apparatus 21 is provided to keep the cleanliness in the carrying space 19 at an adequately high level. Further, in the carrying space 19 of the carrier-side housing 16, the carrier robot 22 is provided for carrying each wafer 12.

Figure 3:
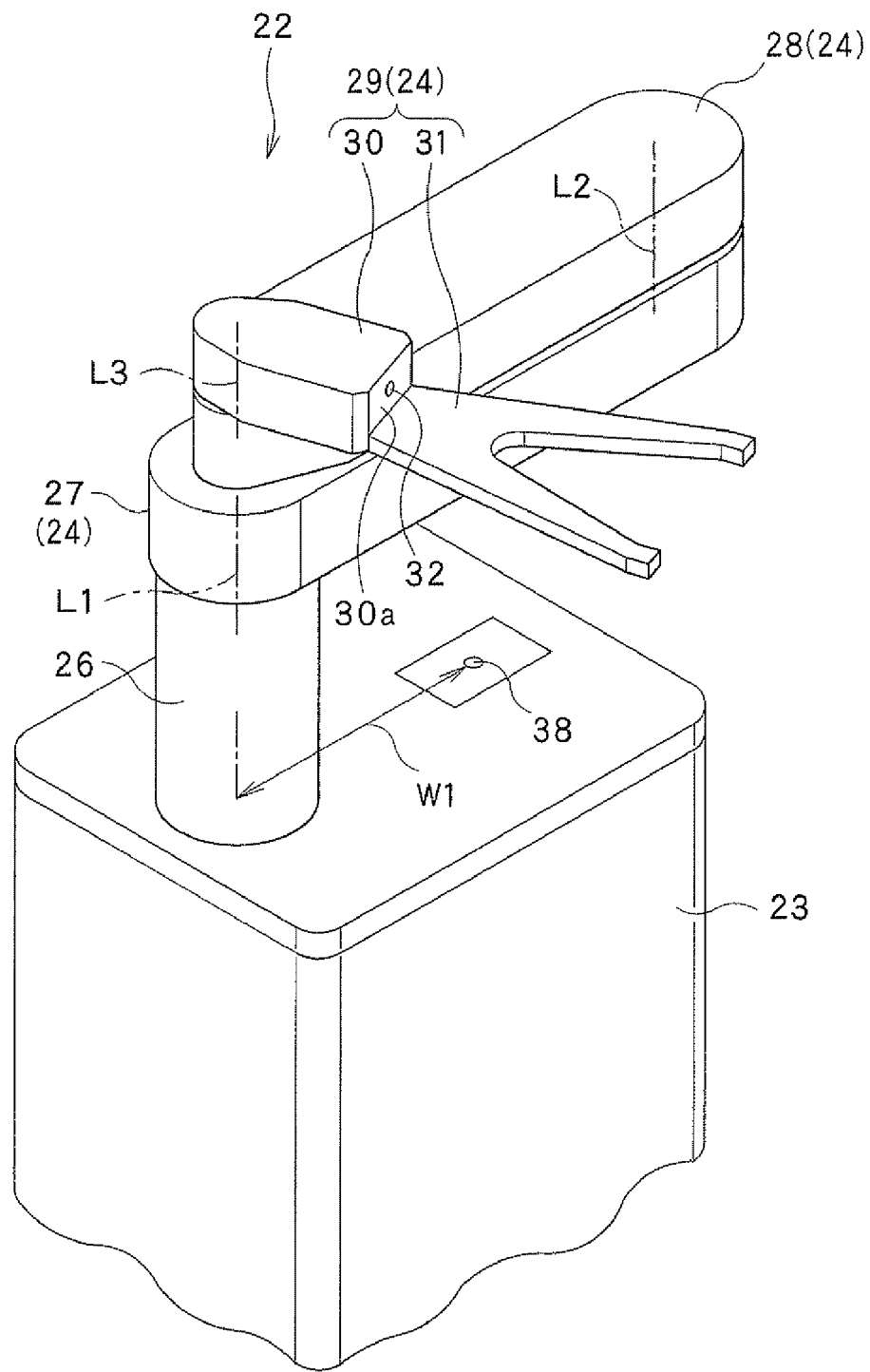
FIG. 3 is an enlarged perspective view showing the carrier robot.
Figure 4:
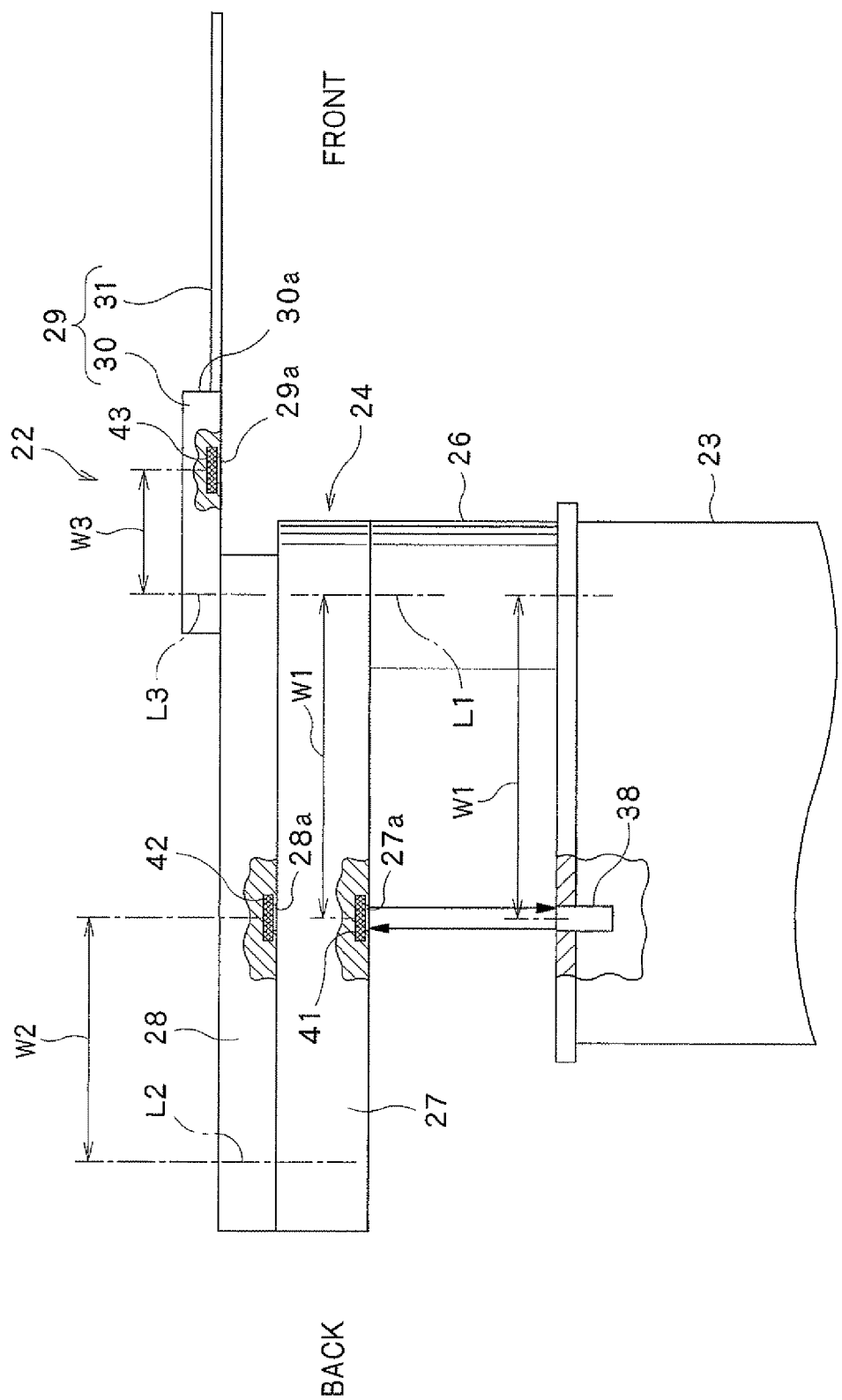
FIG. 4 is a side view showing the carrier robot shown in FIG. 3.
Figure 5:
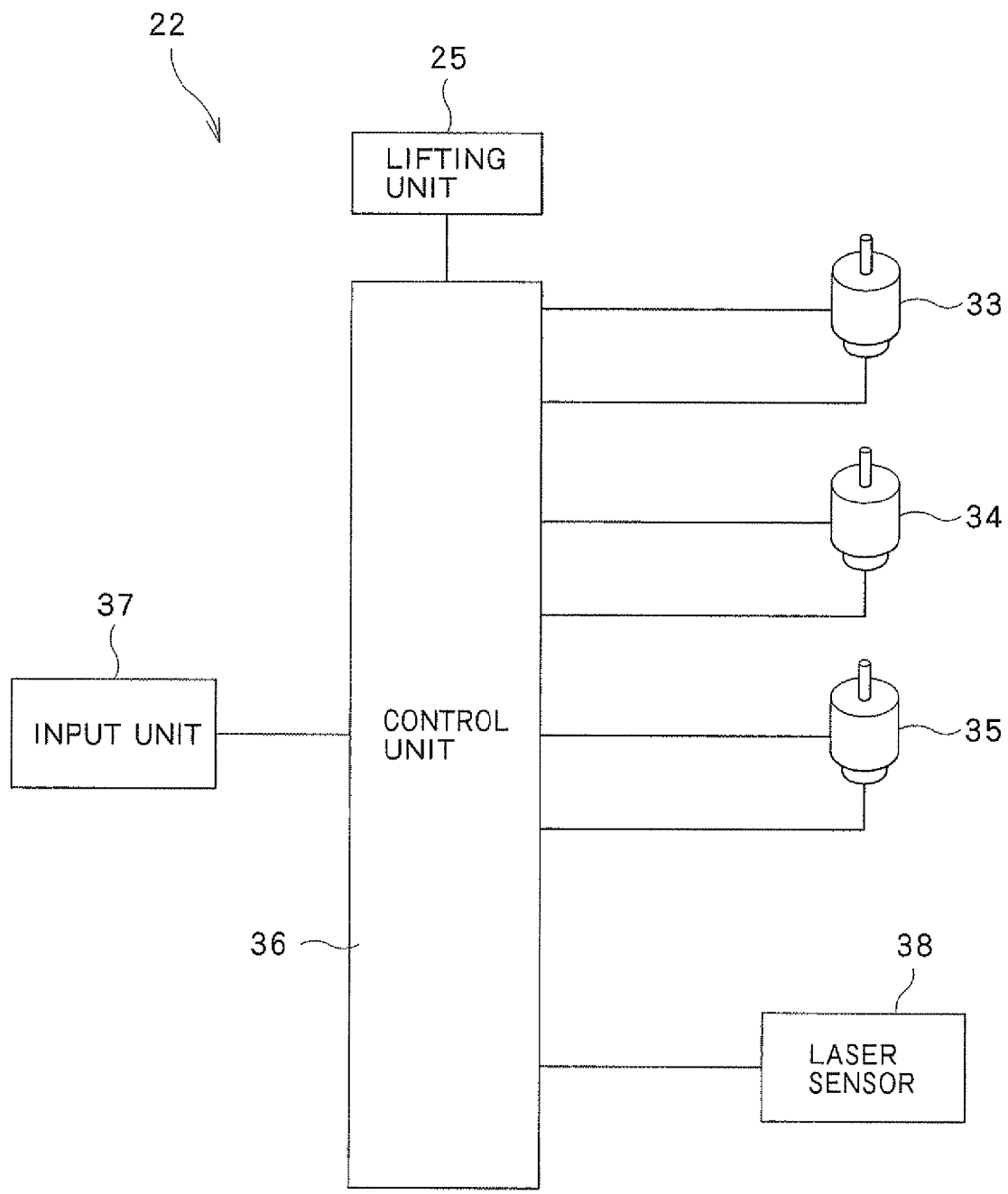
FIG. 5 is a block diagram illustrating an electrical construction of the carrier robot.

The enlarged perspective view of FIG. 3 is provided for showing the carrier robot 22. FIG. 4 is provided for showing the carrier robot 22 in one side view, and the block diagram of FIG. 5 illustrates the electrical construction of the carrier robot. In FIG. 4, for better understanding and clarity, the carrier robot 22 is partly shown in a section. Now, with reference to such drawings as well as to FIGS. 1 and 2, the carrier robot 22 will be described. Namely, the carrier robot 22 includes the base 23 and arm 24. The base 23 is fixed to the carrier-side housing 16, and includes the lifting unit 25.

The lifting unit 25 includes a shaft member 26. To a top end portion of the shaft member 26, the arm 24 is attached, such that this arm 24 can be angularly displaced relative to the shaft member 26. Further, this arm 24 can be lifted in the vertical direction with vertical movement of the shaft member 26 (see FIG. 2). The arm 24 is composed of the plurality of connection members 27, 28, 29, thus having a plurality of joints. Therefore, this arm 24 can take various postures in order to move the robot hand 29 (which is attached on the distal end side of the arm 24) to various positions (see two-dot chain lines and three-dot chain lines in FIG. 1). Namely, in this embodiment, the arm 24 includes the first connection member 27 and second connection member 28 in addition to the robot hand 29.

The first connection member 27 is formed into a rod-like shape, and one end, in the longitudinal direction, of this member 27 is connected with the shaft member 26, such that this member 27 can be rotated about the axis L1 relative to the shaft member 26. Meanwhile, the other end, in the longitudinal direction, of the first connection member 27 is connected with the second connection member 28, such that the two connection members 27, 28 can be angularly displaced relative to each other. More specifically, the second connection member 28 is also formed into the rod-like shape, and one end, in the longitudinal direction, of this member 28 is connected with the first connection member 27, such that this member 28 can be angularly displaced about the axis L2 relative to the first connection member 27. Meanwhile, the other end, in the longitudinal direction, of the second connection member 28 is connected with the robot hand 29, such that the two members 28, 29 can be angularly displaced relative to each other.

The robot hand 29 includes a robot hand main body 30 and a hand part 31, wherein the robot hand main body 30 is connected with the second connection member 28, such that the robot hand 29 can be angularly displaced about the axis L3 relative to the second connection member 28. In this case, a sensor 32 for detecting a target point, such as the position of each wafer 12 or the like, is provided to the robot hand main body 30. The sensor 32 is provided in one side face 30a of the robot hand main body 30. This sensor 32 is provided as the so-called coaxial type laser sensor configured to emit laser beam toward a reflector (not shown) provided at each target point and then receiving the laser beam reflected from the target point, thereby detecting this target point. In this robot hand main body 30, the sensor is arranged and oriented such that the laser beam is emitted vertically to the one side face 30a. In this case, the hand part 31 is attached to this side face 30a.

Namely, the hand part 31 is fixed, at its proximal end, to the one side face 30a of the robot hand main body 30, and is bifurcated toward the distal end thereof. This bifurcated distal end portion of the robot hand main body 30 can serve to place thereon each wafer 12 to be carried.

To each of the first connection member 27, second connection member 28 and robot hand 29, respectively connected to be angularly displaced relative to one another, a motor 33, 34 or 35 is provided. Namely, with the actuation of each motor 33, 34, 35, the first connection member 27, second connection member 28 and robot hand 29 can be angularly displaced, respectively. Further, in order to drive each motor 33, 34, 35, a control unit 36 is electrically connected thereto. In addition, the lifting unit 25 and an input unit 37 are respectively connected with the control unit 36. Thus, the actuation of the lifting unit 25 can be controlled by the control unit 36, and the input unit 37 can allow various commands or instructions to be respectively inputted to the control unit 36.

The control unit 36 serves to control each angle of the first connection member 27, second connection member 28 and robot hand 29, by driving each corresponding motor 33, 34, 35, in accordance with a preset program. More specifically, the control unit 36 first obtains each angle of the first connection member 27, second connection member 28 and robot hand 29, based on an encoded value sent from an encoder attached to each motor 33, 34, 35, and then controls each motor 33, 34, 35.

In this case, each angle is adjusted based on a reference (0 degree) defined when each connection member 27, 28, 29 takes each preset reference posture, and the control unit 36 can control or adjust each reference posture. For instance, the reference posture is adjusted, in advance, to the zero posture upon the shipment from the factory or the like, before each connection member 27, 28, 29 is controlled. Further, in this case, the zero posture is set in advance for each connection member 27, 28, 29. Namely, by controlling the angle of each connection member 27, 28, 29, in accordance with the preset program and based on each reference posture, as the reference, the robot hand 29 can be moved in a predetermined route corresponding to the program.

In this embodiment, the zero posture of the first connection member 27 is the posture in which this member 27 extends in the forward or backward direction. The zero posture of the second connection member 28 is the posture in which this member 28 is completely overlapped with the first connection member 27 in the plan view thereof, and thus the axis L1 and axis L3 are located on substantially the same axis. Further, the zero posture of the robot hand 29 is the posture in which this robot hand 29 is completely overlapped with the second connection member 28 in the plan view thereof. Accordingly, when all of the connection members 27, 28, 29 take their zero postures, such connection members 27, 28, 29 are completely overlapped relative to one another in the plan view, as shown in the two-dot chain lines in FIG. 1. However, each zero posture is not limited to such a posture as described above.

As described above, before each connection member 27, 28, 29 is controlled, the angle of each connection member 27, 28, 29 is adjusted in advance to take the zero posture thereof set at 0 degree. However, because of an angular shift due to the inadvertent or accidental collision between the arm 24 and the other structures provided in the apparatus or prolonged and continuous use of the carrier robot, the angle of each connection member 27, 28, 29 upon taking the zero posture thereof is sometimes shifted from 0 degree. Of course, in such a state, the arm 24 can no longer be controlled to be moved in a predetermined or desired route, upon the operation of the robot hand 29. Besides, there is a risk that the arm 24 may seriously collide with the other structures provided in the apparatus. Therefore, it is necessary to adjust again the angle of each connection member 27, 28, 29 upon taking the zero posture thereof to 0 degree. To this end, the carrier robot 22 has a zero-posture adjustment function for automatically adjusting the angle of each connection member in the zero posture thereof to 0 degree. Further, in this embodiment, for achieving such a zero-posture adjustment function, the laser sensor 38 is electrically connected with the control unit 36.

More specifically, the laser sensor 38 is located, at a predetermined distance W1 when seen in the plan view, from the axis L1, and is embedded in a top portion of the base 23. This laser sensor 38 is the coaxial type sensor, in which a semiconductor laser used as the light emitting unit and a light receiving sensor used as the light receiving unit are integrated together. Namely, this laser sensor 38 can serve to emit the laser beam in a direction substantially vertical to the surface of the top portion of the base 23, as well as receive the laser beam reflected and coming thereto in a direction reverse to the direction in which the laser beam is emitted therefrom.

Further, the reflectors 41, 42, 43 are respectively embedded in bottom portions of the respective connection members 27, 28, 29. Each reflector 41, 42, 43 is exposed downward via each opening 27a, 28a, 29a formed in the bottom portion of each connection member 27, 28, 29, thereby to reflect the laser beam emitted from the laser sensor 38. In this case, each reflector 41, 42, 43 is the regression-type reflector configured to reflect the laser beam in the direction reverse to the direction in which the laser beam has traveled toward this reflector.

The first reflector 41 is provided to the first connection member 27 with the center thereof being located at the distance W1 from the axis L1 in order to reflect the laser beam emitted from the laser sensor 38, when the first connection member 27 is moved or displaced to take a predetermined first detection posture. Herein, the first detection posture is defined as the posture, in which the first connection member 27 is angularly displaced by a preset angle θ11 from the zero posture thereof. In this embodiment, however, since the first detection posture is also defined as the zero posture, the angle θ11 is 0 degree.

The second reflector 42 is provided to the second connection member 28 with the center thereof being located at a predetermined distance W2 from the axis L2 in order to reflect the laser beam emitted from the laser sensor 38, when the first and second connection members 27, 28 are respectively moved or displaced to take a predetermined second detection posture. Herein, the second detection posture is defined as the posture, in which the first connection member 27 is angularly displaced by a preset angle θ21 from the zero posture thereof, and in which the second connection member 28 is angularly displaced about the axis L2 by another preset angle θ22 from the zero posture thereof (see FIG. 7B(d)).

The third reflector 43 is provided to the robot hand 29 with the center thereof being located at a predetermined distance W3 from the axis L3 in order to reflect the laser beam emitted from the laser sensor 38, when the first and second connection members 27, 28 as well as the robot hand 29 are respectively moved or displaced to take a predetermined third detection posture. Herein, the third detection posture is defined as the posture in which the first connection member 27 is angularly displaced about the axis L1 by a preset angle θ31 from the zero posture thereof, and in which the second connection member 28 is angularly displaced about the axis L2 by another preset angle θ32 from the zero posture thereof, and in which the robot hand 29 is angularly displaced about the axis L3 by still another preset angle θ33, from the zero posture thereof (see FIG. 7A(e)).

Figure 6:
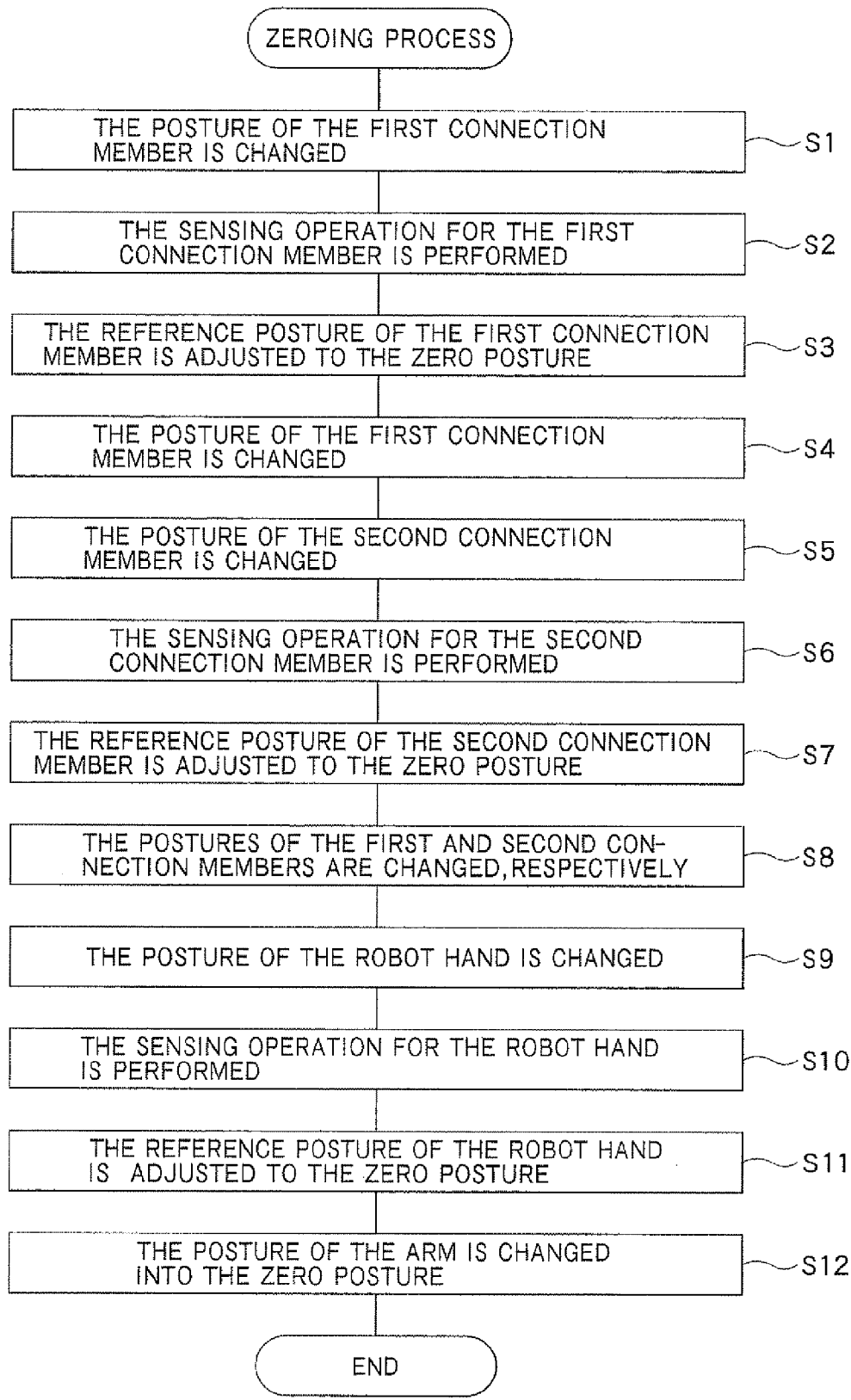
FIG. 6 is a flow chart illustrating one procedure for adjusting the zero posture of each connection member.
Figure 7A:
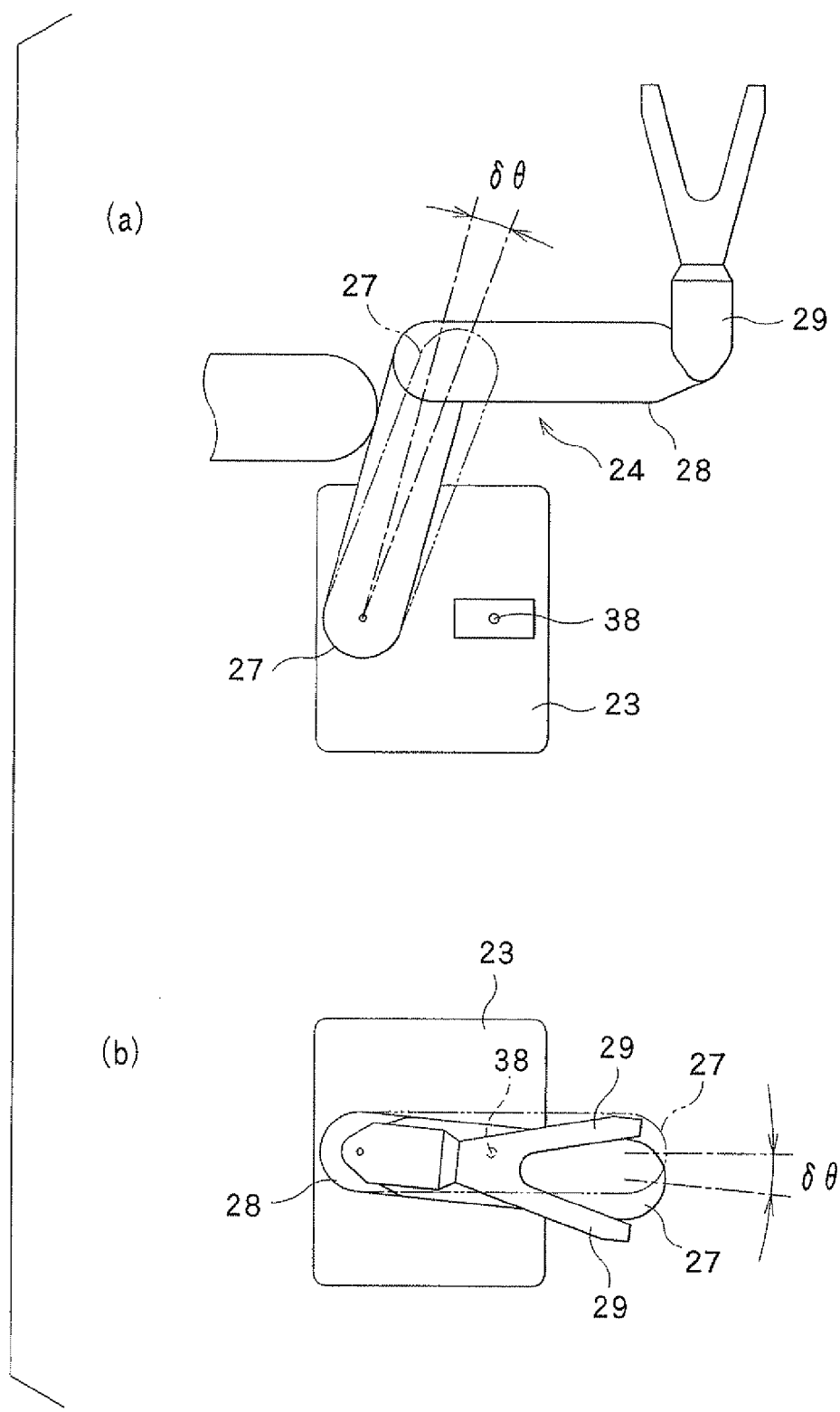
FIG. 7A is a diagram for illustrating the procedure for adjusting the zero posture of each connection member.
Figure 7B:
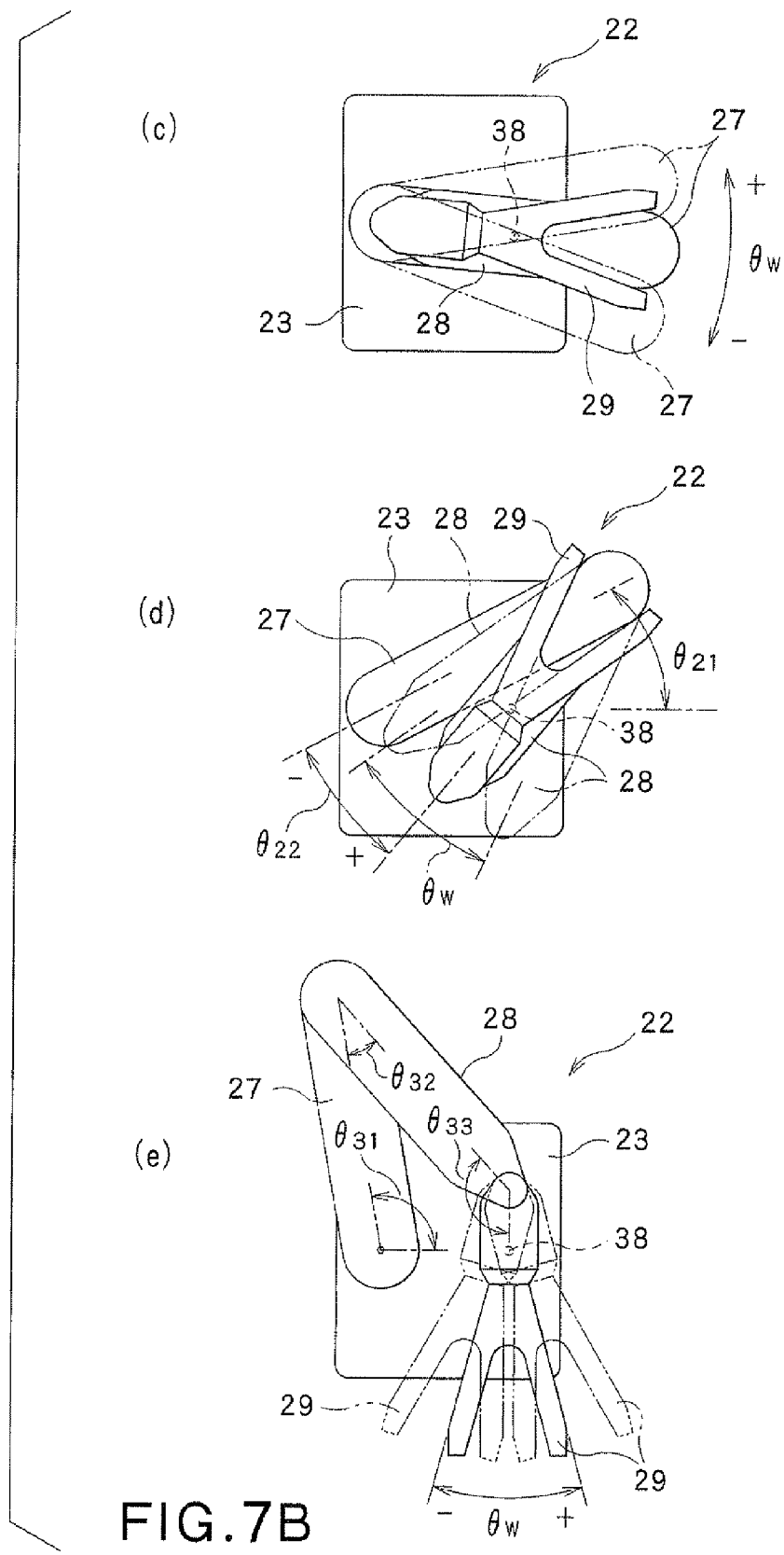
FIG. 7B is another diagram for illustrating the procedure for adjusting the zero posture of each connection member.

The flow chart of FIG. 6 illustrates one procedure for adjusting the zero posture of each connection member 27, 28, 29. The diagrams of FIG. 7A and FIG. 7B are respectively provided for illustrating the procedure for adjusting the zero posture of each connection member. Hereinafter, the procedure for adjusting the zero posture due to the zero-posture adjustment function will be described. First, as shown in FIG. 7(A)(a), due to the inadvertent or accidental collision between the arm 24 (in this embodiment, the first connection member 27) and any other structure provided in the processing space 15, carrying space 19 or the like, during the movement of the robot hand 29, the first connection member 27 is shifted by an angle δθ relative to the output shaft of the motor 33 (see chain lines in FIG. 7(A)(a)). For instance, this angular shift δθ is within a range of from 1 to 2 degrees.

Further, due to such a collision as described above, the angular displacement of the first connection member 27 is stopped. In this case, in order to further angularly displace the stopped first connection member 27 to a predetermined angular position, the control unit 36 will once increase the electric current flowed through the motor 33 for increasing the torque of this motor 33. As a result, when the current flowed through the motor 33 reaches a preset value, or when the torque of the motor 33 reaches a preset torque, the control unit 36 will judge that the arm 24 is collided with some structure provided in the processing space or the like, and then stop the movement of the robot hand 29. Thereafter, when the worker inputs a command for performing a zero-posture adjustment process to the control unit 36 via the input unit 37, the zero-posture adjustment process is started, and then the procedure goes to Step S1 of FIG. 6.

In the Step S1, the first connection member 27 is angularly displaced in order to set the angle of this member 27 at 0 degree (see FIG. 7A(b)). However, at this time, since the first connection member 27 is angularly shifted relative to the correct position (i.e., the output shaft of the motor 33), the posture of this member 27 is not returned to the zero posture even after the angle thereof is returned to 0 degree. Namely, as shown in FIG. 7A(a), the angle of the first connection member 27 is shifted by the angle δθ relative to the angle of the zero posture. Thus, once the angle of the first connection member 27 is returned to 0 degree, the procedure goes to Step S2.

The Step S2 is provided for sensing or detecting the first detection posture. Namely, in this Step S2, the first connection member 27 is swayed within a predetermined angular range θw, e.g., ±5 degrees, with the 0 degree being used as a reference, while the laser beam is emitted from the laser sensor 38 (see two-dot chain lines in FIG. 7B(c)). In this case, each positive (or plus (+)) angle indicates the angular displacement in the anticlockwise direction in the drawings relative to the 0 degree reference, while each negative (or minus (−)) angle indicates the angular displacement in the clockwise direction in the drawings relative to the 0 degree reference. As a result, the amount of the laser beam received by the laser sensor 38 will be increased, as the first connection member 27 approaches this sensor 38 during the sway movement thereof.

Figure 8:
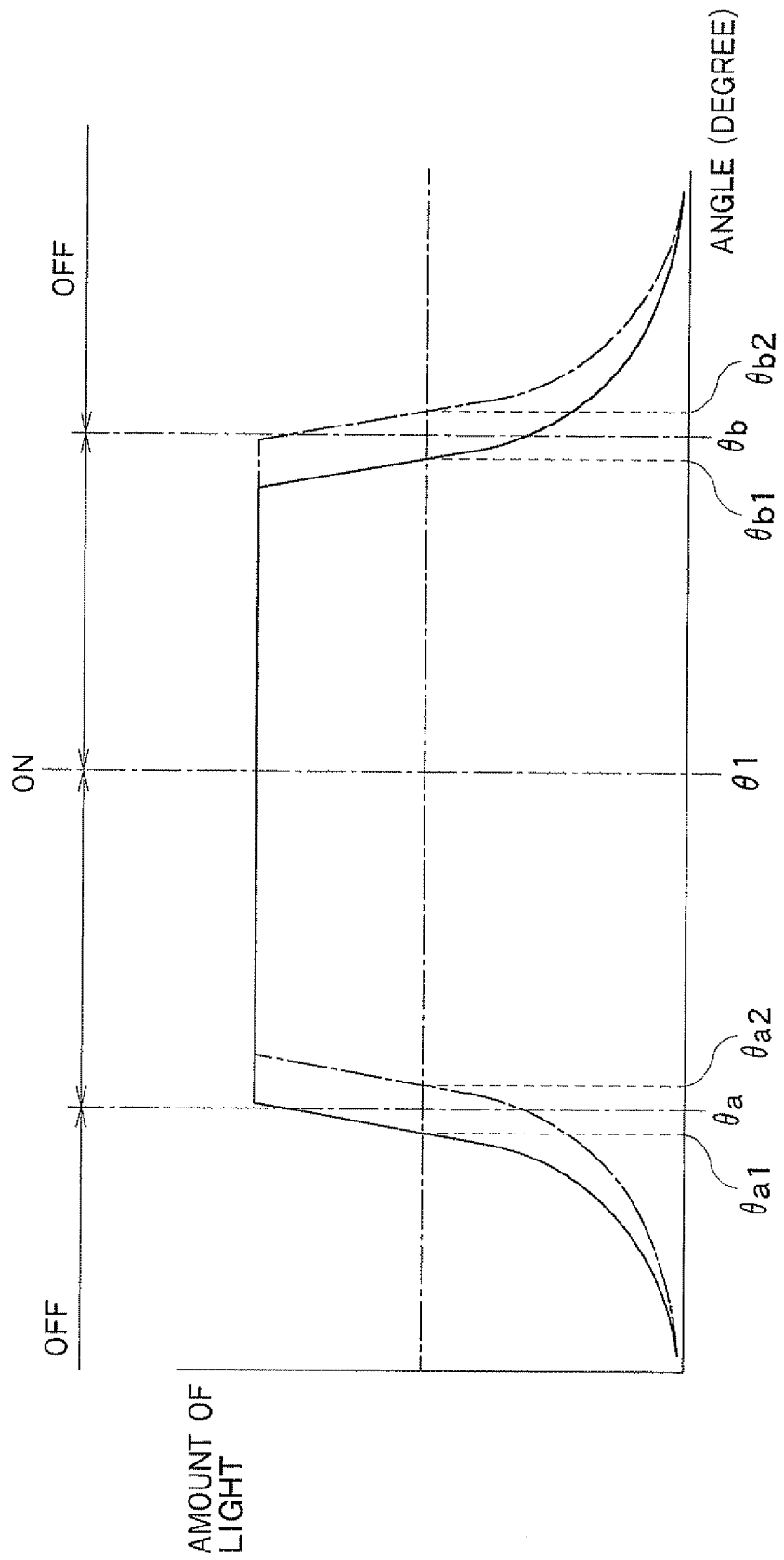
FIG. 8 is a graph showing changes of the amount of light received by a laser sensor in the vicinity of an angle θ1, when the first connection member is swayed.

The graph of FIG. 8 shows the changes of the amount of the laser beam received by the laser sensor 38 in the vicinity of the angle θ1 during the sway movement of the first connection member 27. Theoretically, the amount of the light beam received by the laser sensor 38 becomes the maximum when the first connection member 27 is in the first detection posture. Therefore, by detecting the posture of the first connection member 27 that maximizes the amount of the light beam received by the laser beam 38, the angle θ1, at which the first connection member 27 is in the first detection posture, can be obtained.

However, the laser sensor 38 is usually designed for performing such a limited measurement for the light amount that this sensor 38 can only serve to output an ON signal to the control unit 36 when the amount of the received light exceeds a preset light amount Q, while switching the ON signal into an OFF signal when the amount of the received light becomes less than the preset light amount Q. Therefore, in this embodiment, the control unit 36 is provided for adequately detecting the first detection posture, even in the case of using such a usual laser sensor 38.

More specifically, the control unit 36 serves to obtain an angle θa of the first connection member 27 when the ON signal is outputted as well as to obtain an angle θb of the first connection member 27 when the ON signal is switched into the OFF signal. In this case, it can be assumed that the amount of the received light becomes the maximum at an intermediate angle between such two angles θa and θb. As such, the control unit 36 can eventually assume one proper intermediate angle as the aforementioned angle θ1. In this way, even in the case of using such a laser sensor 38 that can detect or sensor the light beam only in a limited light amount range, the angle θ1 can be adequately detected.

In addition, the laser sensor 38 generally shows hysteresis in the changes of the amount of the received light relative to the angular position of the first connection member 27. Namely, the amount of the received light detected by the laser sensor 38 generally differs between the two cases, i.e., the case in which the first connection member 27 is angularly displaced in the anticlockwise direction and the case in which this connection member 27 is angularly displaced in the clockwise direction (see solid lines and chain lines depicted in FIG. 8). Therefore, the control unit 36 first detects and obtains an angle θa1 of the first connection member 27 when the ON signal is outputted as well as detects and obtains an angle θb1 of the first connection member 27 when the ON signal is switched into the OFF signal, while angularly displacing this connection member 27 in the anticlockwise (or clockwise) direction. Then, the control unit 36 detects and obtains an angle θa2 of the first connection member 27 when the ON signal is outputted as well as detects and obtains an angle θb2 of the first connection member 27 when the ON signal is switched into the OFF signal, while angularly displacing this connection member 27 in the reverse direction.

Thereafter, the control unit 36 calculates an average angle θa when the ON signal is outputted from the angles θa1 and θa2, as well as calculates an average angle θb when the ON signal is switched into the OFF signal from the angles θb1 and θb2. Subsequently, the control unit 36 calculates the intermediate angle of such two average angles θa and θb. As described above, this intermediate angle can be assumed as the aforementioned angle θ1. In this manner, the angle θ1 when the first connection member 27 is in the first detection posture can be obtained. Thus, the changes in the first detection posture of the first connection member 27 due to the hysteresis in the light amount detected upon the sensing operation, depending on the direction of the angular displacement of this connection member 27, can also be corrected. In this way, once the angle θ1 can be obtained, the procedure goes to Step S3.

Now, referring again to FIGS. 6, 7A and 7B, the Step S3 is provided for adjusting the reference position of the first connection member 27. Namely, in the Step S3, the reference posture of the first connection member 27, i.e., the posture when the angle of the first connection member 27 is 0 degree is adjusted to the zero posture thereof. More specifically, in this Step S3, the first connection member 27 is first angularly displaced to the angle θ1 obtained by the control unit 36. Then, based on the relationship that the first detection posture is matched with the zero posture, the control unit 36 resets the angle θ1 of the first connection member 27 being in the first detection posture at 0 degree. With this operation, the angle of the first connection member 27 when it is in the zero posture thereof is set at 0 degree. Thus, the reference posture of the first connection member 27 can be adjusted to the zero posture. Namely, as described above, when the first detection posture is matched with the zero posture, the reference posture can be readily adjusted to the zero posture. In this way, once the reference posture of the first connection member 27 is adjusted to the zero posture, the procedure goes to Step S4.

The Step S4 is provided for changing the posture of the first connection member 27 in order to adjust the reference posture of the second connection member 28 to the zero posture thereof. More specifically, in this Step S4, the first connection member 27 is angularly displaced by an angle θ21 from the zero posture thereof. Once this angular displacement is ended, the procedure goes to Step S5.

In the Step S5, the second connection member 28 is angularly displaced to an angle θ22 (see FIG. 7B (d)). Once this angular displacement is ended, the procedure goes to Step S6. This Step S6 is provided for sensing or detecting the second detection posture. More specifically, in this Step S6, the second connection member 28 is swayed within the predetermined angular range θw, e.g., ±5 degrees, with the angle θ22 being used as the reference, while the laser beam is emitted from the laser sensor 38 (see two-dot chain lines in FIG. 7B(d)). Then, similar to the case of sensing the aforementioned first detection posture, the control unit 36 serves to perform the sensing operation for the second detection posture, and then obtains the angle θ2 when the second connection member 28 is in the second detection posture. Once the angle θ2 is obtained, the procedure goes to Step S7.

The Step S7 is provided for adjusting the reference posture, i.e., the posture at 0 degree, of the second connection member 28 to the zero posture of this connection member 28. Namely, in the Step S7, the second connection member 28 is first angularly displaced to the angle θ2 obtained by the control unit 36. Then, based on the relationship that the second detection posture is angularly displaced by the angle θ22 from the zero posture of the second connection member 28, the control unit 36 resets the angle θ2 of the second connection member 28 being in the second detection posture at the angle θ22. In this way, the angle when the second connection member 28 is in the zero posture becomes 0 degree. Thus, the reference posture of the second connection member 28 can be adjusted to the zero posture. Once the reference posture of the second connection member 28 can be adjusted to the zero posture, the procedure goes to Step S8.

The Step S8 is provided for changing the posture of each of the first and second connection members 27, 28, in order to adjust the reference posture of the robot hand 29 to the zero posture. More specifically, in this Step S8, the first connection member 27 is angularly displaced by an angle θ31 from the zero posture thereof, and the second connection member 28 is angularly displaced by an angle θ32 from the zero posture thereof. Once this operation is ended, the procedure goes to Step S9.

In the Step S9, the robot hand 29 is angularly displaced to an angle θ33 (see FIG. 7B (e)). Once this angular displacement to the angle θ33 is ended, the procedure goes to Step S10. This Step S10 is provided for sensing the third detection posture. More specifically, in this Step S10, the robot hand 29 is swayed within the predetermined angular range θw, e.g., ±5 degrees, with the angle θ33 being used as the reference, while the laser beam is emitted from the laser sensor 38 (see two-dot chain lines in FIG. 7B(e)). Then, similar to the case of sensing the aforementioned first and second detection postures, the control unit 36 serves to perform the sensing operation for the third detection posture, and then obtains the angle θ3 when the robot hand 29 is in the third detection posture. Once the angle θ3 is obtained, the procedure goes to Step S11.

The Step S11 is provided for adjusting the reference posture, i.e., the posture at 0 degree, of the robot hand 29 to the zero posture of this robot hand 29. Namely, in the Step S11, the robot hand 29 is first angularly displaced to the angle θ3 obtained by the control unit 36. Then, based on the relationship that the third detection posture is angularly displaced by the angle θ33 from the zero posture of the robot hand 29, the control unit 36 resets the angle θ3 of the robot hand 29 being in the third detection posture at the angle θ33. In this way, the angle when the robot hand 29 is in the zero posture becomes 0 degree. Thus, the reference posture of the robot hand 29 can be adjusted to the zero posture. Once the reference posture of the robot hand 29 is adjusted to the zero posture, the procedure goes to Step S12.

In the Step S12, the angles of the first connection member 27, second connection member 28 and robot hand 29 are respectively returned to 0 degree, based on each adjusted reference posture. As such, the arm 24 can be returned to the zero posture thereof, and thus the zero-posture adjustment process is ended.

In this zero-posture adjustment process performed by using the carrier robot 22 constructed as described above, the reference posture is adjusted to the zero posture by using the laser beam. Therefore, the reference posture can be adjusted to the zero posture, more accurately, with further improved accuracy of attachment of the laser sensor 38. Further, also in the case of inadvertent or accidental collision of the second connection member 28 or robot hand 29, the reference posture of each connection member 27, 28, 29 can be accurately adjusted to the zero posture in the same manner as described above.

Figure 9:
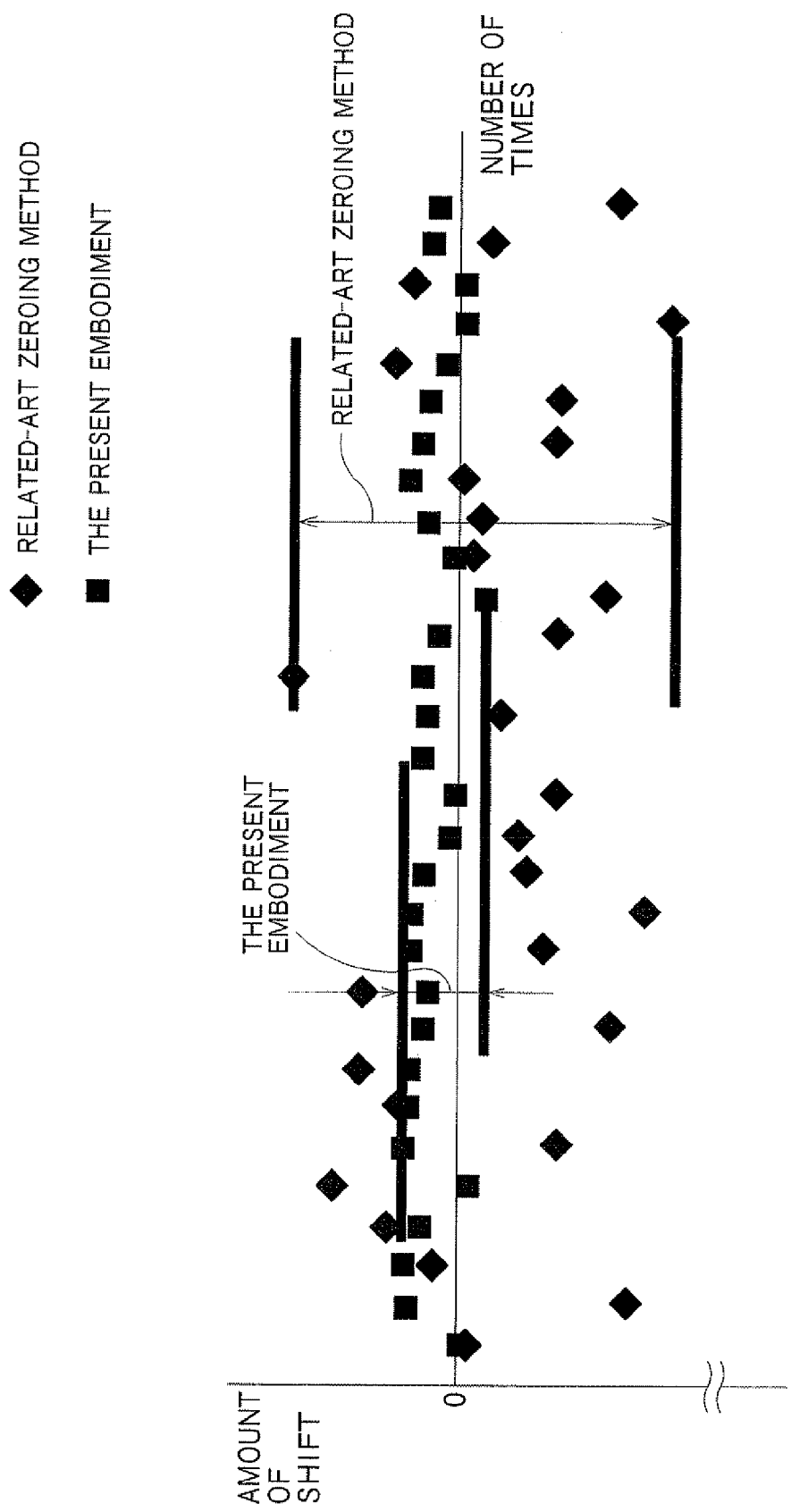
FIG. 9 is a graph showing changes of the amount of the shift between the reference posture and the zero posture.
Figure 10:
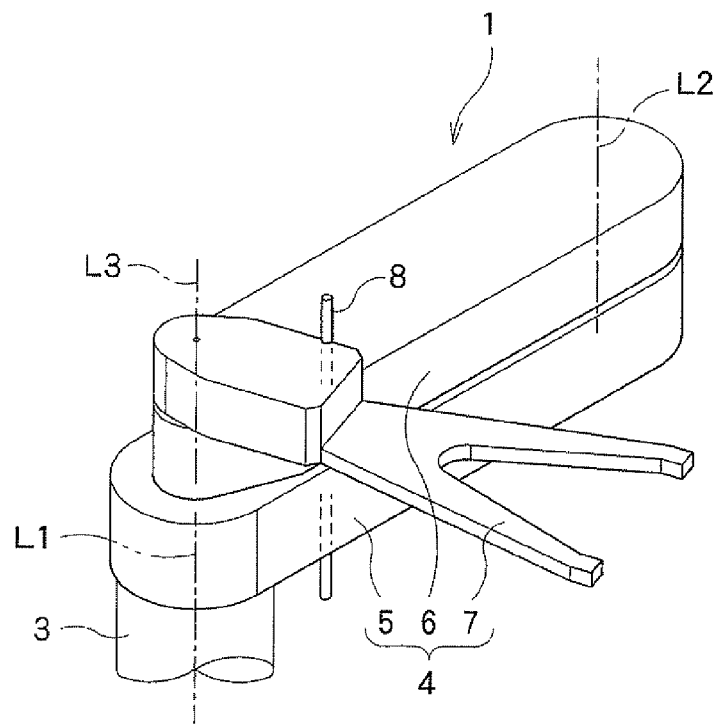
FIG. 10 is an enlarged perspective view partly showing the carrier robot of the related art.
Figure 11:
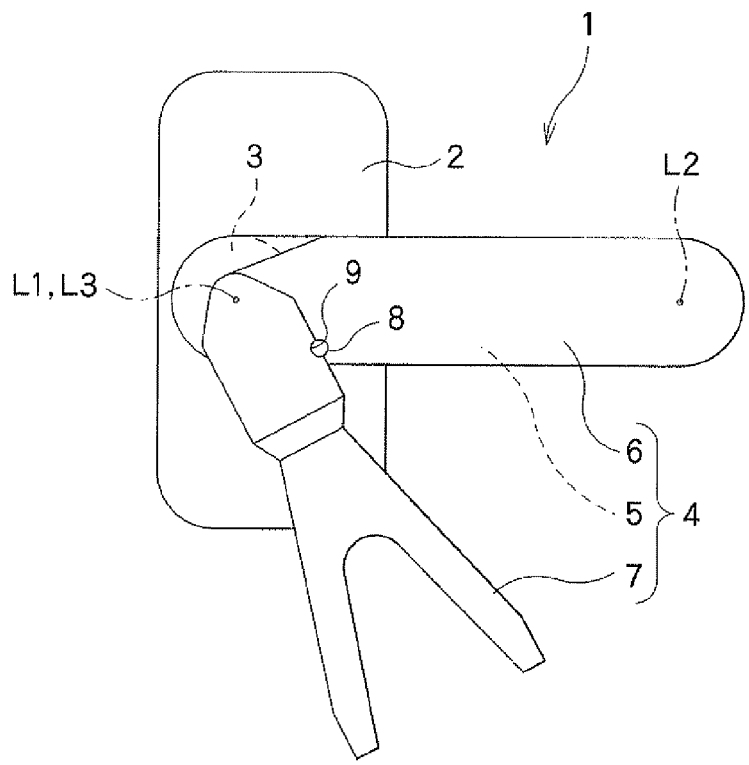
FIG. 11 is a plan view showing the carrier robot shown in FIG. 10.

The graph of FIG. 9 shows the changes in the amount of the shift between the reference posture and the zero posture, respectively detected, in the case in which the reference posture is adjusted by the zeroing method of this embodiment and in the case in which the reference posture is adjusted by the zeroing method of the related art. More specifically, in FIG. 9, the vertical axis indicates the amount of the shift, while the horizontal axis indicates the number of times the zero-posture adjustment process was performed. Further, in FIG. 9, each tetragonal point denotes the amount of the shift in the case in which the reference posture is adjusted by the zeroing method of this embodiment, while each rhombic point denotes the amount of the shift in the case in which the reference posture is adjusted by the zeroing method of the related art. Namely, as is clearly seen from FIG. 9, the variation of the amount of the shift in the case in which the reference posture is adjusted by the zeroing method of this embodiment is significantly less than the variation of the amount of the shift in the case in which the reference posture is adjusted by the zeroing method of the related art. Accordingly, it can be clearly seen that the zeroing method of this embodiment can adjust the reference posture to the zero posture, more accurately.

Generally, in a usual program, each angle is provided with the zero posture being used as the reference. Therefore, by accurately adjusting the reference posture to the zero posture, each connection member 27, 28, 29 can be accurately controlled at a desired angle. In this way, the detection error between a route provided in advance in the program and the route along which each connection member 27, 28, 29 is actually moved can be well suppressed.

Further, in the zero-posture adjustment process performed by using the robot 22, since the reference posture is adjusted by using the laser beam, when the worker gives a necessary command to the control unit 36, this control unit 36 can automatically serve to angularly displace each connection member 27, 28, 29, such that the laser sensor 38 can receive the laser beam, thereby to adjust each reference posture to the zero posture.

Therefore, there is no need for the worker to manually adjust each reference posture to the zero posture. Thus, even in such a place that makes it difficult for the worker to operate the robot or place that is unsuitable for such operation, the reference posture can be readily adjusted to the zero posture.

In particular, in the semiconductor processing equipment 10, it is necessary to keep the cleanliness in the carrying space 19 at a considerably high level. In this case, if the worker enters the carrying space 19, the cleanliness will be rather deteriorated therein. However, by utilizing the zero-posture adjustment process due to the carrier robot 22, the reference posture can be automatically adjusted to the zero posture without the need for the worker to enter the carrying space 19, as such keeping the cleanliness at a desirably high level. Therefore, there is no need for providing any other additional process for improving or keeping the cleanliness in the carrying space 19, thereby reducing the time required for restarting the entire process.

Further, in the above zero-posture adjustment process performed by using the robot 22, since the reference posture is adjusted to the zero posture from the connection member positioned nearer to the base 23, i.e., in the order of the first connection member 27, second connection member 28 and robot hand 29, the reference posture of each connection member can be adjusted at a time. As such, the time required for adjusting the reference posture can be significantly reduced.

Additionally, in the above carrier robot 22, only one laser sensor 38 is provided to the base 23 by utilizing the reflectors 41, 42, 43. Namely, with this configuration, the number of the laser sensor 38 can be reduced, as such reducing the number of the parts or components required for the entire system. Thus, the production cost can be significantly reduced. Further, since each reflector 41, 42, 43 is the regression-type reflector and the laser sensor 38 is the coaxial laser sensor, the light or beam reflected by each reflector can be effectively received, even in the case in which the accuracy of attachment for such parts or components is relatively low. As such, the yield of the production can be enhanced. It should be noted that the semiconductor laser configured to emit the light may be provided to the base 23, and a proper light receiving sensor may be provided to each connection member 27, 28, 29. Otherwise, the light receiving sensor, such as the semiconductor laser or the like, may be provided to the base 23, and the semiconductor laser configured to emit the light may be provided to each connection member 27, 28, 29.

In this embodiment, when the worker inputs the necessary command to the control unit 36 via the input unit, this control unit 36 serves to start the zero-posture adjustment process. In this case, when any one of the connection members 27, 28, 29 is collided with some structure, the robot 36 may serve to stop the operation of the robot hand 29 and then automatically perform the zero-posture adjustment process. For instance, once the torque applied to any one of the connection members 27, 28, 29 reaches or exceeds a predetermined torque, the control unit 36 judges that the connection member 27, 28 or 29 is collided with some structure, and then serves to stop the operation of the robot hand 29 and automatically perform the zero-posture adjustment process.

In this case, in order to judge whether or not the torque applied to any one of the connection members 27, 28, 29 reaches or exceeds the predetermined torque, the control unit 36 judges whether or not the electric current flowed through any one of the three motors 33, 34, 35 reaches or exceeds a predetermined value. By performing the zero-posture adjustment process, automatically, in such a manner, after the collision of any one of the connection members 27, 28, 29, each reference posture can be automatically adjusted to the zero posture. Therefore, the operation can be restarted soon after the collision.

Further, the judgment whether or not any one of the connection members 27, 28, 29 is collided with some structure may be performed based on a shift or difference between a target angle and an actual angle of each connection member 27, 28, 29, or otherwise based on a deviation between the target angle and the actual angle of each connection member 27, 28, 29.

While the carrier robot 22 has been described herein as an articulated robot including the three connection members 27, 28, 29, this carrier robot 22 may have two or less connection members, or otherwise may have four or more connection members. Further, in place of using the articulated robot, a cylindrical-coordinate-system robot or polar-coordinate-system robot may be used. In addition, while the carrier robot 22 is configured to include the three connection members 27, 28, 29, respectively connected, such that each connection member 27, 28, 29 can be angularly displaced, this carrier robot 22 may be provided as a Cartesian-coordinate-system robot including the three connection members 27, 28, 29, respectively connected, such that each connection member 27, 28, 29 can be linearly displaced relative to one another.

Further, while the above embodiment has been described in regard to the carrier robot 22, this embodiment is also applicable to a welding robot, a coating robot, an assembling robot and the like. Additionally, while the carrier robot 22 has been described as one applied to the semiconductor processing equipment 10, this carrier robot 22 may be applied to proper production equipment, such as an electronic machine, an industrial machine or the like, or otherwise may be used solely.

It should be noted that the present invention is not limited to the above embodiment, and that various additions, deletions and alterations can be made to this embodiment without departing from the scope and gist of this invention.

The invention claimed is:

1. A robot having an auto-zeroing function, including a connection member relatively displaceably connected, and being configured to control a displacement of the connection member based on a reference posture that can be adjusted, the robot comprising:
  a light emitting unit configured to emit a laser beam in a predetermined direction;
  a light receiving unit configured to receive the laser beam when the connection member is located in a detection posture that is away, by a preset displacement amount, from a predetermined zero posture; and
  a zeroing unit configured to relatively displace the connection member so as to make the light receiving unit receive the laser beam, and then to adjust the reference posture to the zero posture based on a posture of the connection member when the laser beam is received as well as on a relationship between the zero posture and the detection posture,
  wherein the zeroing unit first relatively displaces the connection member in one direction so as to make the light receiving unit receive the laser beam, and then relatively displaces the connection member in another direction different from the one direction so as to make the light receiving unit receive the laser beam, and thereafter determines an average value of postures of the connection member respectively detected when the laser beam is received upon a displacement in the one direction and when the laser beam is received upon a displacement in the another direction as a posture of the connection member when the laser beam is received, wherein the robot further comprises:
a base to which a plurality of connection members are attached such that the connection members can be respectively displaced relative to the base as well as can be respectively displaced relative to one another;
a reflector provided to each of the plurality of connection members and configured to reflect the laser beam emitted from the light emitting unit,
wherein the light emitting unit and the light receiving unit are provided to the base,
wherein the reflector is a regression-type reflector,
wherein the light emitting unit and the light receiving unit are integrated together so as to constitute a coaxial laser sensor,
wherein the zeroing unit adjusts the reference posture one after another from the connection member positioned nearer to the base,
wherein an optical axis of the light emitting unit is perpendicular to a plane in which the connection member rotates, and
wherein one reflector is provided to a surface of each connection member.

2. The robot having the auto-zeroing function, according to claim 1,
wherein the connection members are respectively configured to be rotatable relative to one another, and
wherein the zeroing unit adjusts the connection member to the zero posture when a torque applied to the connection member upon a relative pivot movement becomes equal to or greater than a preset torque, or when an angular shift between a relative angle and a target angle of the connection member becomes equal to or greater than a preset value, or when the deviation between the relative angle and the target angle of the connection member becomes equal to or greater than a preset value.

3. The auto-zeroing method according to claim 1,
wherein a plurality of connection members are respectively attached to a base such that the connection members can be respectively displaced relative to the base, as well as can be respectively displaced relative to one another, and
wherein the laser beam receiving step and the reference posture adjustment step are respectively performed one after another from the connection member positioned nearer to the base.

* * * * *